United States Patent
Billiet et al.

(10) Patent No.: US 6,733,703 B2
(45) Date of Patent: May 11, 2004

(54) METHOD FOR CONTROLLING THE DIMENSIONS OF BODIES MADE FROM SINTERABLE MATERIALS

(76) Inventors: Romain L. Billiet, 135A Malacca Street, Penang (MY), 10400; Hanh Thi Nguyen, 135A Malacca Street, Penang (MY), 10400

( * ) Notice: Subject to any disclaimer, the term of this patent is extended or adjusted under 35 U.S.C. 154(b) by 231 days.

(21) Appl. No.: 09/962,526

(22) Filed: Sep. 20, 2001

(65) Prior Publication Data

US 2002/0037232 A1 Mar. 28, 2002

Related U.S. Application Data

(60) Provisional application No. 60/237,360, filed on Sep. 26, 2000.

(51) Int. Cl.$^7$ .................................................. B22F 1/00
(52) U.S. Cl. ...................... 264/40.1; 264/656; 264/669; 419/10; 419/31; 419/38; 419/65
(58) Field of Search .............................. 419/10, 31, 38, 419/65; 264/656, 669, 670, 40.1, 40.3

(56) References Cited

U.S. PATENT DOCUMENTS

| | | | |
|---|---|---|---|
| 4,704,079 A | | 11/1987 | Pluim, Jr. |
| 5,234,655 A | | 8/1993 | Wiech, Jr. |
| 5,267,854 A | * | 12/1993 | Schmitt .......................... 433/8 |
| 5,976,457 A | * | 11/1999 | Amaya et al. |
| 6,008,281 A | * | 12/1999 | Yang et al. |

* cited by examiner

Primary Examiner—Christopher A. Fiorilla

(57) ABSTRACT

Precise control of the shrinkage upon sintering of bodies made from mixtures of particulate materials and organic binders is achieved through precision pycnometry of the particulate materials and of the resulting sintered bodies, thus allowing a single molding tool to be used to produce parts in different sizes and from different materials and to tight manufacturing tolerances.

5 Claims, No Drawings

METHOD FOR CONTROLLING THE DIMENSIONS OF BODIES MADE FROM SINTERABLE MATERIALS

CROSS-REFERENCE TO RELATED APPLICATIONS

This application claims priority to U.S. Provisional patent application Ser. No. 60/237,360 filed on Sep. 26, 2000.

REFERENCES CITED

| U.S. Patent Documents | | | |
| --- | --- | --- | --- |
| 4,704,079 | November 1987 | Pluim, Jr. | 425/190 |
| 5,234,655 | August 1993 | Wiech | 264/227 |
| 5,976,457 | November 1999 | Amaya et al. | 419/36 |

STATEMENT REGARDING FEDERALLY SPONSORED RESEARCH OR DEVELOPMENT

Not Applicable.

REFERENCE TO A MICROFICHE APPENDIX

Not Applicable.

BACKGROUND

1. Field of Invention

The present invention relates to the control of the dimensions of bodies made from sinterable particulate materials. More specifically, this invention relates to the fabrication of commercial parts from sinterable materials in different sizes and from different materials with a minimal investment in tooling.

2. Description of Prior Art

With the exponential growth of technology and the globalization of markets, manufacturers of mass-produced products such as computers, cars, watches, and the vast array of today's electronic consumer items, are challenged by an increasingly educated and discriminating consumer population expecting innovative, technically advanced and esthetically pleasing products incorporating the latest technological developments.

In order to remain competitive, manufacturers of such mass-produced items must be in a position to rapidly change the design of their products. This is not just to keep abreast of the fast changes in technology, but also to maintain a steady stream of new products with greater functionality and appealing esthetic appearance, e.g. different shapes, sizes, materials, external surface finish, colors, properties, etc., as demanded by the market.

Another market driven fad consists of fabricating a wide array of consumer items such as watch cases and bracelets, belt buckles, spectacle frames, and the like, from the exotic alloys used in the aerospace industry, e.g. titanium, superalloys, cobalt, rhodium, zirconia, tungsten carbide, etc., such materials carrying with them an image of high technology.

As a result, the economic life of many mass-produced consumer products is often very short, sometimes—as in the case of watches, computers or cellular phones—only a mere six months. The new products, which must be produced in replacement of the obsolete ones, naturally imply substantial investments in new tooling. Also the raw materials may be costly or difficult to source. Machining may be laborious and difficult, particularly for extremely small or high precision parts, and generate excessive amounts of scrap which may be costly to recycle.

Understandably then, the prior art has attempted to make new products without incurring the huge costs of new tooling and without generating the scrap associated with conventional machining. One such net-shape manufacturing technique is the well-known powder metallurgy (P/M) process which forms parts by pressing metallic powders into simple shapes such as gears and pinions and then sinters these to a useful density. However P/M parts are generally pressed in a uniaxial direction, which limits the freedom of shape and may introduce density gradients in the pressed part, resulting in shape distortion upon sintering. The second drawback of the P/M process is the substantial amount of residual porosity after sintering, a condition that weakens the material properties of the parts and limits their use in commercial applications. For demanding applications P/M parts often require further densification, e.g. by isostatic pressing.

Another prior art method used to reduce machining costs is the powder injection molding process in which metal or ceramic powders are mixed with an organic binder and molded into green parts using the machinery and tooling of the plastics industry. Following extraction of the organic binder, the green parts are sintered as in the P/M process. This is usually accompanied by a substantial shrinkage, of the order of 20% linear, resulting in diminutives or miniatures of the corresponding green parts. However the shrinkage is not always isotropic resulting in poor dimensional control over the end products and the need for iterative empirical tooling adjustments.

When the new commercial products are not too different in size and configuration from the obsolete ones—like a new model of watch case or watch bracelet link—the prior art at times attempts to reduce the cost of new tooling by modifying the existing tooling so that it can still be used for the new products. For instance, in the injection molding of plastic parts it is common to provide a mold with interchangeable cavity inserts, each insert being for a different product. However, the savings achieved by using new inserts in an existing mold base are often marginal, as it is precisely the fabrication of the molding inserts which constitutes the most laborious, time consuming and expensive part of building a molding tool.

The prior art has attempted to reduce the costs of mold inserts by making them via the powder injection molding route as disclosed, for example, in Amaya et al., U.S. Pat. No. 5,976,457. However, like any other powder injection molded parts, the green cavity inserts undergo shrinkage during sintering and, therefore, are likely to suffer from the same process weaknesses, namely part distortion and anisotropic shrinkage.

Yet another way the prior art has tried to reduce the cost of tooling is by making mold inserts from ceramic materials. One example is disclosed in Pluim, Jr. U.S. Pat. No. 4,704,079 who teaches a process whereby the mold inserts are formed by freeze casting particulate silicon metal and then reaction bonding the green inserts in nitrogen gas to generate silicon nitride. However, the dimensional accuracy of these inserts is generally poor so that extensive secondary machining is required in the green state first, using bonded carbide tools, and after sintering, using diamond tooling.

Still another way the prior art has attempted to reduce the cost of tooling is by extending the functionality of existing tooling into new products which are miniatures of those the existing tooling was originally designed for. This is of great interest when said miniatures are of such small dimensions that their fabrication by conventional means is extremely difficult, costly or even impossible. An example of such efforts at miniaturization is disclosed in Wiech, Jr., U.S. Pat. No. 5,234,655 where, through a series of iterative cycles, miniature parts are achieved. Each cycle consists of making a first green part in a first mold cavity. After sintering, during which the green part shrinks about 20% linearly, the product is used as a mold core in a second mold cavity and a second green part is produced which is a miniaturized mirror shape of the first green part. The second green part is then sintered in turn upon which, it too, shrinks about 20% linearly. The second sintered part is then used as a mold core in the cavity of a third mold to yield a third green part which is a miniature mirror shape of the second green part. Upon sintering of this third green part, a further 20% linear shrinkage takes place and a product, which constitutes a miniature of the first sintered product, is obtained. Wiech suggests that this cycle be repeated as many times as may be necessary to end up with a product that has the desired dimensions. The limitations of this procedure are obvious.

In conclusion, the prior art has not satisfactorily solved the problem of reducing the cost of new tooling or extending the functionality of existing tooling into new products.

Conceivably, this objective could be realized if products in a range of precisely predetermined sizes could be made using a single molding tool. Even more profit could be generated from existing tooling if one tool could also be used to make products of identical dimensions but from different materials. For example, a mold designed to produce plastic watch cases could be used to make stainless steel watch cases of different sizes, e.g. for gents, ladies and children. The same molding tool could also be used to make watch cases of identical dimensions but from different materials, e.g. stainless steel, tungsten carbide, zirconia, etc. This ideal situation would obviously only be possible if the different materials molded could be formulated with a precisely engineered and controlled shrinkage.

BRIEF SUMMARY OF THE INVENTION

In accordance with the present invention the problems of the prior art are substantially overcome by providing a method to formulate an engineered thermoplastic mixture of sinterable particulate material and organic binder from which parts can be formed by prior art techniques such as molding, casting, machining and the like, the thus formed parts, upon extraction of the organic binder from them and sintering, displaying a uniform, isotropic, constant, and accurately predetermined shrinkage.

OBJECTS AND ADVANTAGES

It is the primary object of this invention to provide a method to formulate a thermoplastic compound composed of at least one sinterable particulate material and at least one degradable thermoplastic ingredient, and displaying a predetermined, constant and isotropic shrinkage upon extraction of the thermoplastic constituent or constituents from said thermoplastic compound and sintering of the remaining particulate material or materials.

An additional object of this invention is to provide a method to control and optimize the shrinkage upon sintering of both moldable and non-moldable bodies produced from thermoplastic mixtures of sinterable particulates and organic binders.

It is another object of this invention to provide a method for reducing the investment in new tooling by making articles of identical or variable sizes and from different materials using existing tooling.

It is yet another object of this invention to provide an economical method for increasing the finctionality of existing tooling by extending its capabilities into products of different sizes and from different materials.

It is a further object of this invention to provide a method to produce miniatures of existing products without the need for additional or special tooling It is yet a further object of this invention to provide a method that can be used to mass-produce small parts that cannot be produced easily, economically or at all, by conventional manufacturing techniques.

BRIEF DESCRIPTION OF THE SEVERAL VIEWS OF THE DRAWINGS

Not applicable.

DESCRIPTION OF THE PREFERRED EMBODIMENTS

As in the prior art, this invention starts by compounding a thermoplastic mixture, also called green mixture or green compound, consisting of two distinct and homogeneously dispersed phases, a discrete phase made up of fine particulate matter, and an organic continuous phase, generally termed the organic binder or simply the binder.

The discrete phase of the thermoplastic compound is made up of at least one finely divided particulate material, such as a ceramic or a metallic powder, however it is often made up of powders of different ceramic or metallic materials, either in elemental or prealloyed form, or even mixtures of these. The main directive in selecting the type of ingredients for the discrete phase will be the desired composition of the end product. For instance if the AISI 316L stainless steel composition is intended it will generally be advantageous to use a commercially available prealloyed atomized fine-grained stainless steel powder in which each of the powder particles is already of the AISI 316L composition. An example of such a fine prealloyed powder is the MIM grade 316L stainless steel powder from the Swedish firm Anval Nyby Powder AB which has a granulometry of 80% smaller than 22 micrometers. When a prealloyed powder is not available or is found unsuitable because of quality or cost factors, various elemental and prealloyed powders may be blended in the proper proportions so that, upon sintering, the desired end composition will be achieved. For example when the low CTE (coefficient of thermal expansion) alloy INVAR 36 is attempted, it may be advantageous to mix 64% by weight of iron carbonyl powder Grade E of the International Specialty Products (ISP) company, which has an average particle size of about 4–6 micrometers, with 36% of nickel carbonyl powder type 123 of the Inco Limited company, which has an average particle size of about 7–8 micrometers.

The continuous phase of the thermoplastic compound is made up of at least one thermoplastic organic material though generally it will be made up of several different organic constituents which may include polyolefin resins, silicones, waxes, oils, greases and the like. In most cases various organic surface active materials (surfactants), plasticizers and antioxidants will also be included to optimize the characteristics of the particulate materials and to avoid or retard premature oxidative degradation of the organic binder. Usually the binder will be specifically formulated for a given discrete phase in order to confer and optimize the thermoplastic compound's properties, such as its rheological behavior, solidification-, glass transition-, flow- and melting temperatures, as well as the thermal decomposition pattern of the organic binder.

The number of combinations and permutations possible at this point are very great and anyone skilled in the art will be well aware of the number of possibilities that exist to them to obtain the desired characteristics of the binder. However, a typical formula for the organic binder mixture would be approximately one-third by weight of polyethylene, one-third by weight of paraffin wax, one-third by weight of beeswax with perhaps 0.1 through 0.2 percent of stearic acid and 0.05% of an antioxidant added.

The discrete particulate materials and thermoplastic binder ingredients are mixed into a homogeneous mass at a temperature in excess of the melting point or flow point of the thermoplastic materials. Techniques for producing thermoplastic compounds are well described in the prior art and will not be elaborated on here.

The thermoplastic or green compound is formulated in such way that it is a solid at or below the normal room temperatures prevailing in temperate climates, i.e. usually below 25 degrees Celsius. At such temperatures the green compound can be machined by well-known conventional machining techniques such as milling, drilling, turning, reaming, punching, blanking, sawing, cutting, filing and the like.

For cold-forming machining operations such as milling, turning or blanking the thermoplastic mixture can be conveniently shaped into bar stock, billet or plate form at the time of formulation. If necessary, the hardness of the machining stock can be increased, e.g. to facilitate machining, by cooling it prior to machining.

If a heat-assisted forming technique such as casting, molding, laminating or extrusion is employed the green compound is advantageously pelletized at the time of formulation.

The organic binder is formulated so as to be extractable from the thermoplastic or green compound using well-known techniques such as aqueous or organic solvent extraction, oxidative degradation, catalytic decomposition, vacuum distillation, wicking and the like, leaving behind a framework that is substantially devoid of organic material. This binder-free structure can now be sintered to its final dense end configuration in accordance with prior art techniques. During sintering the open porosity, inevitably generated as a result of binder elimination, is gradually eliminated.

What is crucial in the application of this invention is that the exact volumetric ratio of discrete phase to that of the thermoplastic compound be established with the greatest possible accuracy. This ratio, also termed the volumetric loading or simply the loading of the thermoplastic compound, often designated by $\Phi$, can be expressed as:

$$\Phi = V_d/V_g \tag{1}$$

where $V_d$ is the total volume of the discrete phase constituents and $V_g$ is the total green volume The conventional way to determine actual shrinkage upon sintering of thermoplastic compounds of the type described above is to make a test specimen of the green mixture, and to measure its dimensions before and after binder extraction and sintering. The ratio of the green to the corresponding sintered dimension constitutes the shrinkage factor, often designated by the letter K, thus:

$$K = L_g/L_s \tag{2}$$

where $L_g$ is the length of the green dimension and $L_s$ the length of the sintered dimension The shrinkage factor is needed to calculate the dimensions of the green part, or those of the mold cavity when molding is the method used to form the green part. Equation (2) can be rewritten as:

$$K^3 = (L_g/L_s)^3 = L_g^3/L_s^3 = V_g/V_s \tag{3}$$

where $V_s$ is the volume of a sintered cube of side $L_s$ and $V_g$ is the volume of the corresponding green cube of side $L_g$ Combining equations (1) and (3):

$$\Phi = (V_d/V_s) * K^{-3} \tag{4}$$

Under steady state processing conditions, the term $V_d/V_s$ is a constant 'alloying factor' which can be determined for a given set of conditions. Equation (4) can be rewritten as:

$$\Phi = (M_d/\delta_d)(M_s * \delta_s) * K^{-3} \tag{5}$$

where $M_d$ and $\delta_d$ are, respectively, the mass and density of the total discrete phase and $M_s$ and $\delta_s$ are, respectively, the mass and density of the sintered part.

Assuming there is conservation of matter during sintering (i.e. no reaction sintering), $M_d = M_s$ and equation (5) becomes:

$$\Phi = (\delta_s/\delta_d) * K^{-3} = C * K^{-3} \tag{6}$$

where $$C = \delta_s/\delta_d \tag{7}$$

If C is different from unity, some atomic rearrangement has taken place during sintering and will affect the shrinkage factor.

A first preferred embodiment of this invention is the ability make parts which, due to their small size, are difficult or impossible to fabricate economically by conventional techniques.

By way of example, assuming AISI 316L stainless steel mini-gears with diameter 0.75 mm are required but that the smallest gears that can be machined economically have diameter 1 mm. The desired shrinkage factor in this case is K=1/0.75 =1.333. A suitable stainless steel powder is procured and its density found to be 7.89 g/cm$^3$. Next a test specimen made from this powder is sintered and its density found to be 7.85 g/cm$^3$. Equation (6) yields $\Phi = C*K^{-3} = (7.85/7.89)*(1.333)^{-3} = 0.4201$ A green compound containing 42.01% by volume of stainless steel powder with the remaining 57.99% being a thermoplastic binder of suitable characteristics is formulated. Green gears of 1 mm diameter are now machined from this compound by conventional techniques and, upon extraction of the binder and sintering, the parts reach their targeted diameter of 0.75 mm.

A second preferred embodiment of this invention is the ability to make parts of constant dimensions but from different materials in a single molding tool. By way of example, assuming an existing injection molding tool, built with a cavity measuring 20 mm is available, it is possible, using this invention, to use this tool to produce say zirconia (zirconium oxide) as well as tungsten heavy alloy (THA) parts of 16 mm dimension. A specific composition of THA is 93% W-4% Ni-3% Fe. The desired shrinkage factor in this situation is K=20/16=1.25

A suitable zirconia powder is procured and its density found to be 5.95 g/cm$^3$. Next a test specimen made from this powder is sintered and its density found to be 6.05 g/cm$^3$. Equation (6) yields $\Phi=C*K^{-3}=(6.05/5.95)*(1.25)^{-3}=0.5206$ A green compound containing 52.06% by volume of zirconia powder with the remaining 47.94% being a thermoplastic binder of suitable characteristics is formulated. Green parts of 20 mm are molded from this compound and, upon extraction of the binder and sintering, reach their targeted dimension of 16 mm.

Next, a suitable prealloyed THA powder is procured—or its individual elemental constituents blended in the proper proportions—and its density (or composite density) found to be 17.5 g/cm$^3$. A test specimen made from this powder is sintered and its density found to be 17.6 g/cm$^3$.

Equation (6) yields $\Phi=C*K^{-3}=(17.6/17.5)*(1.25)^{-3}=0.5149$

A green compound containing 51.49% by volume of THA powder with the remaining 48.51% being a thermoplastic binder of suitable characteristics is formulated and green parts of 20 mm molded from this compound in the same mold as used in the above noted example for the zirconia. Upon extraction of the binder and sintering, the parts reach their targeted dimension of 16 mm.

A third preferred embodiment of this invention is the ability to make metal or ceramic parts from the same material but in reduced size and using a single molding tool. By way of example, assuming the availability of the above noted injection molding tool with a cavity measuring 20 mm, it is possible, using this invention it is possible to first make alumina (aluminum oxide) parts of say 17 mm and, subsequently, alumina parts of say 16 mm.

For the 17 mm parts the desired shrinkage factor is K=20/17=1.1765

A suitable alumina powder is procured and its density found to be 3.88 g/cm$^3$. Next a test specimen made from this powder is sintered and its density found to be 3.97 g/cm$^3$. Equation (6) yields $\Phi=C*K^{-3}(3.97/3.88)*(1.1765)^{-3}=0.6283$ A green compound containing 62.83% by volume of alumina powder with the remaining 37.17% being a thermoplastic binder of suitable characteristics is formulated and green parts of 20 mm molded from this compound. Upon extraction of the binder and sintering, the parts reach their targeted dimension of 17 mm.

For the 16 mm parts the desired shrinkage factor is K=20/16=1.25

Using the same alumina powder as in the case noted above we obtain, using equation (6): $\Phi=C*K^{-3}(3.97/3.88)*(1.25)^{-3}=0.5239$ A green compound containing 52.39% by volume of alumina powder with the remaining 47.61% being a thermoplastic binder of suitable characteristics is formulated and green parts of 20 mm are molded from this compound in the same mold as above. Upon extraction of the binder and sintering, the parts reach their targeted dimension of 16 mm.

A fourth preferred embodiment of this invention is the ability to make metal or ceramic parts in the same material but in increased size and still using a single mold. Assuming again the availability of an injection molding tool with a cavity of 20 mm and that this mold is used to produce 17-4PH stainless steel parts which, upon sintering, measure say 15 mm in length with a sintered density of 7.8 g/cm$^3$. By applying this invention it is possible to use the same mold to make 17-4PH stainless steel parts of, say 16 mm. The density of the 17-4PH powder is found to be, say 7.86 g/cm$^3$. Equation (7) yields: C=7.8/7.86=0.9924

For the 15 mm parts the actual shrinkage factor is $K_{15}$=20/15=1.3333 and the corresponding loading $\Phi_{15}$ is given by using equation (6):

$$\Phi_{15}=C*(K_{15})^{-3}=0.9924*(1.3333)^{-3}=0.4187$$

For the proposed 16 mm parts the desired shrinkage factor is $K_{16}$=20/16=1.25 and the corresponding loading $\Phi_{16}$ is given by equation (6):

$$\Phi_{16}=C*(K_{16})^{-3}0.9924*(1.25)^{-3}=0.5081$$

A new molding compound containing 50.81% by volume of prealloyed 17-4PH stainless steel powder with the remaining 49.19% being a thermoplastic binder of suitable characteristics is formulated. Alternatively, additional metal powder can be added to the existing molding compound to achieve the new loading. Green parts of 20 mm length are molded from this new compound and, upon extraction of the binder and sintering, the parts reach their targeted dimension of 16 mm.

CONCLUSION, RAMIFICATIONS AND SCOPE

In conclusion, the major advantage of this invention resides in the ability to mass-produce both moldable and non-moldable commercial articles from different sinterable materials, to precisely controlled and exacting dimensions, including dimensions which are currently out of the practical or economical reach of conventional forming techniques.

The practical uses of this invention are clearly broad in scope and universal and attempting to enumerate them all would not materially contribute to the description of this invention. However, to name just one practical application is the already mentioned case where a mold designed to produce plastic injection molded watch cases can, by applying this invention, be used to produce stainless steel watchcases in different sizes (e.g. models for gents, ladies and children) or watchcases of the same size but in different materials like tungsten carbide, zirconia, etc.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim as our invention:

1. A method for achieving a preset shrinkage upon sintering of bodies made from mixtures of sinterable particulates and a thermoplastic organic binder by establishing the necessary volumetric composition of said mixtures needed to achieve said shrinkage, comprising:

a. providing sinterable particulates and determining their density, b. sintering said sinterable particulates and determining the density of the resulting sintered body, c. determining the ratio of the sintered density to the density of said sinterable particulates, d. determining the desired shrinkage factor by dividing a mold cavity or green dimension by the corresponding desired sintered dimension, and e. establishing the necessary volumetric fraction of said particulates in a mixture of said particulates and a thermoplastic organic binder in order to achieve said shrinkage factor by dividing said density ratio by the cube of said shrinkage factor.

2. The method as set forth in claim 1 wherein a plurality of sintered parts of identical composition but of different dimensions are achieved.

3. The method as set forth in claim 2, wherein the plurality of sintered parts of identical composition but of different dimensions are achieved using a single mold.

4. The method as set forth in claim 1 wherein a plurality of sintered parts from different materials but of identical sintered dimensions are achieved using a single mold.

5. The method as set forth in claim 1 wherein said sinterable particulates are selected from the class of metals and their alloys, ceramics and their alloys and mixtures of metals and ceramics or their alloys.

* * * * *